(12) United States Patent
Jeng

(10) Patent No.: US 6,664,182 B2
(45) Date of Patent: Dec. 16, 2003

(54) METHOD OF IMPROVING THE INTERLAYER ADHESION PROPERTY OF LOW-K LAYERS IN A DUAL DAMASCENE PROCESS

(75) Inventor: Pei-Ren Jeng, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 8 days.

(21) Appl. No.: 09/840,994

(22) Filed: Apr. 25, 2001

(65) Prior Publication Data

US 2002/0173158 A1 Nov. 21, 2002

(51) Int. Cl.⁷ .......................................... H01L 21/4763
(52) U.S. Cl. ................ 438/638; 257/E21.547; 257/E21.556
(58) Field of Search ................................. 438/618, 638, 438/594; 257/E21.487, E21.547, E21.556

(56) References Cited

U.S. PATENT DOCUMENTS 6,225,204 B1 * 5/2001 Wu et al. ................... 438/594
6,316,351 B1 * 11/2001 Chen et al. ................. 438/638

* cited by examiner

Primary Examiner—William David Coleman
(74) Attorney, Agent, or Firm—Winston Hsu

(57) ABSTRACT

The present invention provides for an improvement of the interlayer adhesion property of the low-K layers in a dual damascene process. The method includes a shallow ion implantation process to bombard a bottom low-k layer for forming a densified layer on the bottom low-k layer. The densified layer can be a used as a substitute in the oxidation of the prior art to avoid the peeling phenomenon between the organic low-k layers.

17 Claims, 3 Drawing Sheets

METHOD OF IMPROVING THE INTERLAYER ADHESION PROPERTY OF LOW-K LAYERS IN A DUAL DAMASCENE PROCESS

BACKGROUND OF THE INVENTION

1. Field of the Invention

The present invention relates a method for improving the interlayer adhesion property of low-k layers in a dual damascene process, and more particularly, to improve the interlayer adhesion property of low-k layers in a dual damascene process which do not require a silicon nitride layer or a silicon oxide layer to act as a stop layer. It can improve the interlayer adhesion property between the low-k layers in a dual damascene process to avoid the peeling phenomenon in the low-k layers and the oxidation layer.

2. Description of the Prior Art

The dual damascene process is a method of stacking structures for forming a metal wire and a plug simultaneously. The method is used to connect the different elements and wires between each layer in a semiconductor wafer, while inter-layer dielectrics are used as isolators from other elements. Since copper metal (Cu) in recent years has been developed with a low resistance, the method of a copper metal dual damascene interconnect in the multi-layer interconnect process has become very important.

Please refer to FIG. 1 of a schematic diagram of a dual damascene structure 11 according to the prior art. As shown in FIG. 1, a semiconductor wafer 10 comprises a bottom copper wire 14 inlayed in a first low-k layer 12 and an upper copper wire 24 inlayed in a trench structure 23 of a second low-k layer 20. The upper copper wire 24 and the bottom copper wire 14 connect with a barrier layer 18 between the first low-k layer 12 and the second low-k layer 20 through a via 22. Wherein the low-k materials are spin-coated both on the first low-k layer 12 and the second low-k layer 20, and the low-k materials have parameters consistent with those of FLARE™ to reduce the RC delay effect between the wires.

The prior art process has to form an oxidation layer 21 to be a dual damascene etch stop layer in the second low-k layer 20. However, the low-k materials has a problem of difficult adhesion to the oxidation layer 21, leading to the second low-k layer being peeled off in the subsequent process.

SUMMARY OF THE INVENTION

It is therefore a primary objective of the present invention to provide a method for a dual damascene interconnect process that does not require a silicon nitride layer or a silicon oxide layer to be a stop layer.

The present invention also provides a method for improving the dual damascene interconnect process. The method not only improves the interlayer adhesion property between the low-k layers in a dual damascene process, but also avoids the peeling phenomenon between the low-k layer and the oxidation layer.

These and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
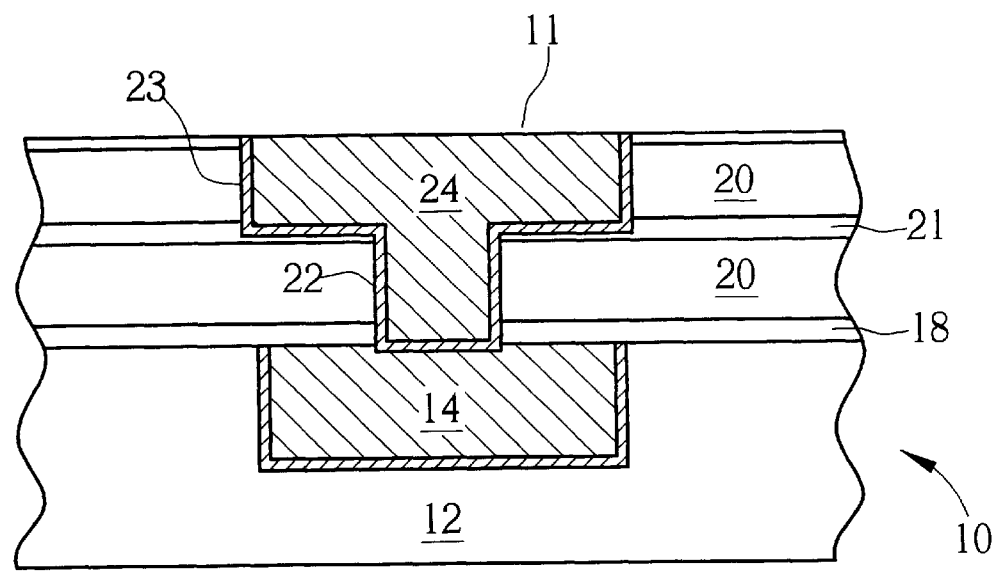
FIG. 1 is a schematic diagram of a dual damascene structure according to the prior.
Figure 2:
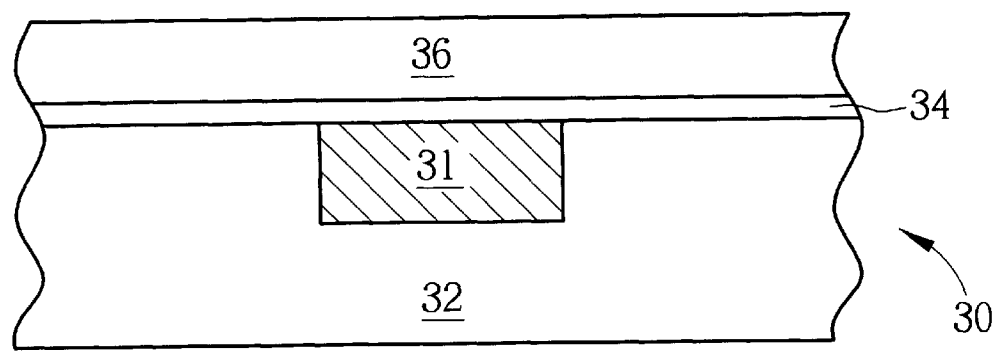
FIG. 2 to FIG. 6 are schematic diagrams of the method according to the preferred embodiment of the present invention.

Please refer to FIG. 2 to FIG. 6 of schematic diagrams of the method according to the preferred embodiment of the present invention. As shown in FIG. 2, the surface of a semiconductor wafer 30 comprises a bottom layer 32, a silicon nitride layer 34 covering the surface of the bottom layer 32 and a low-k layer 36 spin-coated on the silicon nitride layer 34. The bottom layer 32 can be a silicon substrate or another low-k layer. A conductive layer 31 is formed on the bottom layer 32, such as a bottom metal wire, an interconnect, a gate, a source or a drain. The low-k layer 36 can be an organic low-k material that normally is used by the industry, such as FLARE™ produced by the Allied Signal company, SiLK™, poly (arylene ether) polymer or a chemical compound of parylene produced by the Dow Chemical company. The dielectric constant of the low-k layer 36 is about 2.6 to 2.8, and has a thickness in the range of thousands of angstroms to hundreds of micrometers. For simplicity, other elements on the semiconductor wafer 30 are not shown in the FIG. 2.

Figure 3:
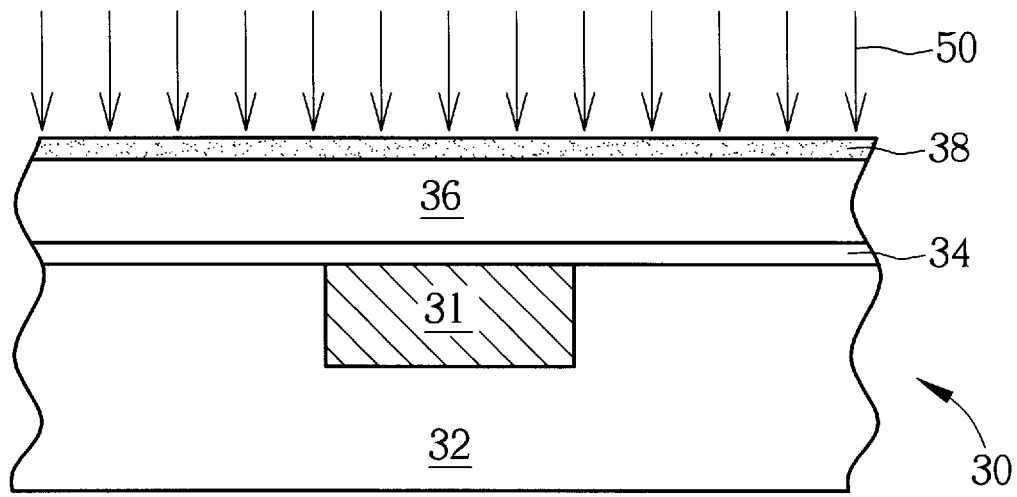

Following that, as shown in FIG. 3, a shallow ion implantation process 50 is performed on the surface of the low-k layer 36. In the preferred embodiment of the present invention, the shallow ion implantation process 50 uses an arsenic ion to bombard the surface of the low-k layer 36 for forming a densified layer 38 on the surface of the low-k layer 36. Wherein, the process follows with energy ranging from 60 Kev to 80 Kev, with a dosage ranging about from 1E13 ions/cm$^2$ to 1E15 ions/cm$^2$ and 1E14 ions/cm$^2$ preferred. The densified layer 38 has a thickness in the hundreds of angstroms.

The feature of the present invention uses the shallow ion implantation process 50 to change the characteristics of the surface of the organic low-k layer 36. It not only makes the surface of the low-k layer 36 more dense after performing the shallow ion implantation process 50, but the unimplanted low-k layer 36 has an obvious etch selectivity in the subsequent etching process. In addition, the shallow ion implantation process 50 also increases the dangling bonds on the surface of the low-k layer 36 at the same time.

However, in another preferred embodiment of the present invention, the shallow ion implantation process 50 also can use the phosphorous ion or the heavy atom, such as Boron Fluoride (BF$_2$), to implant the surface of the low-k layer 36. For example, when using the phosphorous ion to implant, an implantation energy ranging from 50 Kev to 80 Kev should be used, with a dosage ranging from 1E14 ions/cm$^2$ to 1E15 ions/cm$^2$; when using the Boron Fluoride ion (BF$^{2+}$), an implantation energy ranging from 50 Kev to 100 Kev should be used, with a dosage ranging from 1E14 ions/cm$^2$ to 1E16 ions/cm$^2$.

Figure 4:
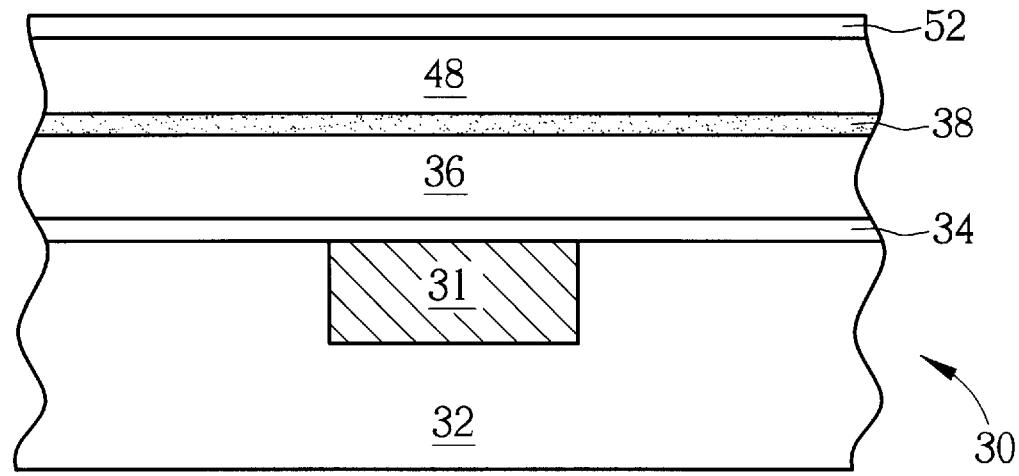

Further, as shown in FIG. 4, spin-coating of a low-k layer 48 is performed on the surface of the densified layer 38. For example, the low-k layer has a thickness in the hundreds of angstroms, and may be FLARE™ produced by the Allied Signal company, SiLK™, poly (arylene ether) polymer, a chemical compound of parylene or other similar organic low-k layer produced by the Dow Chemical company. After this, a passivation layer 52 should be formed on the surface of the low-k layer 48 for protecting the low-k layer 48 from the environment. The passivation layer 52 may be a silicon nitride layer or a silicon oxidation layer.

Since the densified layer 38 is formed after the ion implantation process 50 is performed on the low-k layer 36, the densified layer 36 has the same properties of the low-k layer 48. In addition, the densified layer 38 that was implanted with ions has plenty of dangling bonds; so the densified layer 38 can combine tightly with the low-k layer 48. Further, the densified layer 38 and the low-k layer 48 can together construct a laminated structure for greatly raising the interlayer adhesion property between the low-k layers.

Figure 5:
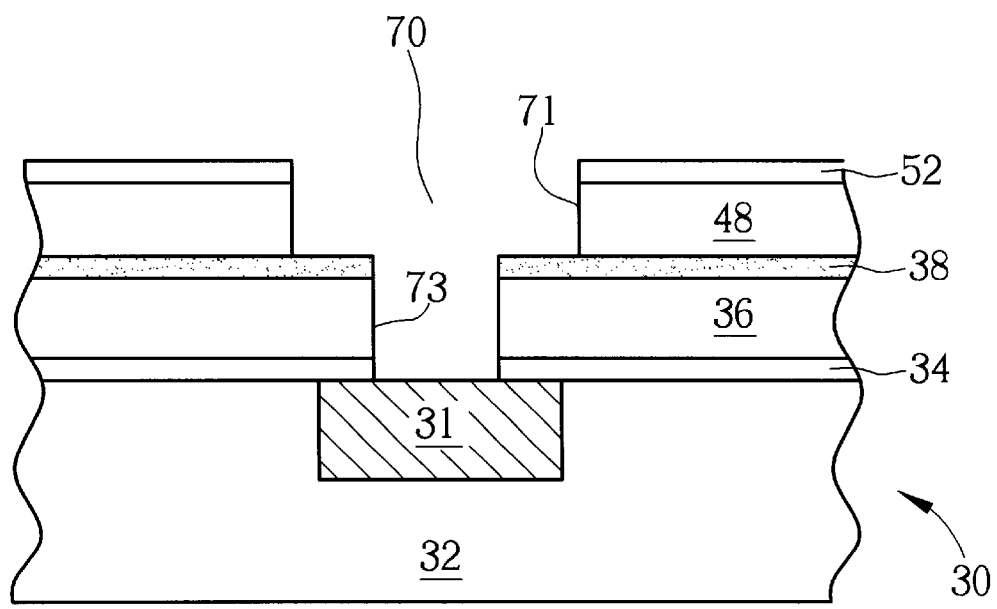

As shown in FIG. 5, a dual damascene process then penetrates the low-k layer 36 and the low-k layer 48 for forming a dual damascene structure 70. The dual damascene structure 70 comprises a wire trench structure 71 and a via structure 73 to connect with the conductive layer 31 below the dual damascene structure 70. The dual damascene process uses a lithography process and an etching process, due to the simplicity of the technology of the lithography and etching processes. The present invention uses a different characteristic of the etching selectivity between the densified layer 38 and the low-k layer 48. Hence, the present invention is suited to use in the via priority dual damascene process, the wire trench priority dual damascene process or the self-aligned dual damascene process.

Figure 6:
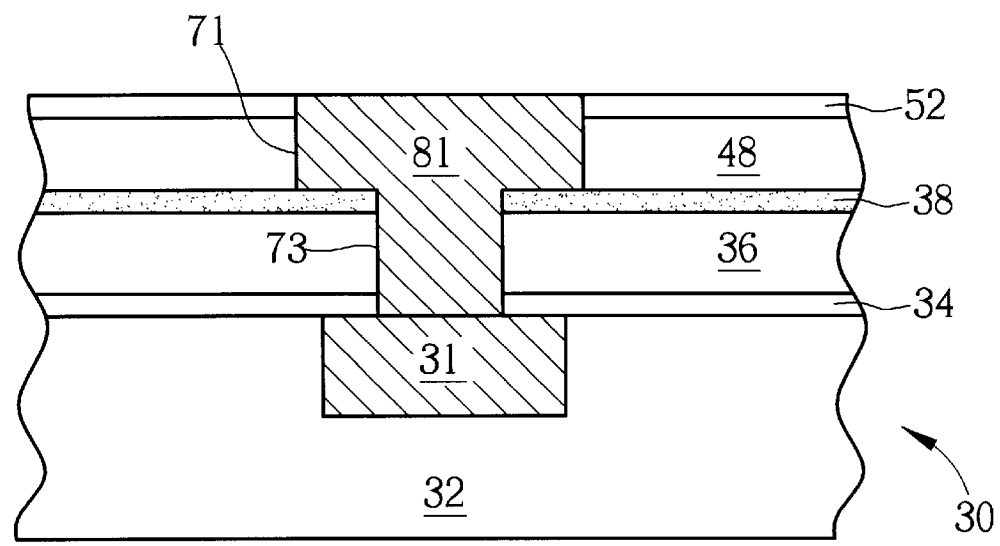

As shown in FIG. 6, the dual damascene 70 is electroplated, and a copper metal layer is filled in the wire trench structure 71 and the via structure 73, and covers the passviation layer 52. Before electroplating the copper metal, a barrier layer (not shown) is normally formed to separate the copper metal layer and the low-k layer surroundings. After that, a chemical mechanical polishing process (CMP) is performed for removing a part of the cooper metal layer above the passivation layer 52. Finally, the copper metal fills in the wire trench structure 71 and the via structure 73 is left, finishing the manufacture of the dual damascene copper interconnects 81 in the present invention.

In comparison with the prior art, the present invention method of the dual damascene interconnects have the following advantages: (1) solving the problem of the interlayer adhesion phenomenon between the organic low-k layers; the problem is caused by the etch stop layer in the dual damascene process according to the prior art, and (2) avoiding the problem of the peeling phenomenon between the organic low-k layers.

Those skilled in the art will readily observe that numerous modifications and alterations of the device may be made while retaining the teachings of the invention. Accordingly, the above disclosure should be constructed as limited only by the metes and bounds of the appended claims.

What is claimed is:

1. A method of improving an interlayer adhesion property of low-k layers in a damascene process, the method comprising:

providing a semiconductor substrate, a first conductive layer being formed within the semiconductor substrate;

forming a first low-k layer upon the first conductive layer;

performing a shallow ion implantation process for forming an etch stop layer within the first low-k layer;

forming a second low-k layer on the surface of the etch stop layer;

forming a passivation layer on the surface of the second low-k layer, wherein the first low-k layer, the etch stop layer, the second low-k layer, and the passivation layer together construct a laminated structure; and performing a damascene process to form a damascene opening in the laminated structure, the damascene opening penetrating the laminated structure and connecting with the first conductive layer.

2. The method of claim 1 wherein the first conductive layer is an inter-metal connection.

3. The method of claim 1 wherein the etch stop layer and the second low-k layer each has a different etching selectively.

4. The method of claim 1 wherein the first low-k layer and the second low-k layer are composed of the same low-k materials.

5. The method of claim 4 wherein the first low-k layer and the second low-k layer are both composed of poly(arylene ether).

6. The method of claim 1 wherein the first low-k layer is composed of a material consistent with parameters of FLARE™, produced by the Allied Signal Company.

7. The method of claim 1 wherein the first low-k layer is composed of a material consistent with parameters of SiLK™, produced by the Dow Chemical Company.

8. The method of claim 1 wherein the second low-k layer is composed of a material consistent with parameters of FLARE™, produced by the Allied Signal Company.

9. The method of claim 1 wherein the second low-k layer is composed of a material consistent with parameters of SiLK™, produced by the Dow Chemical Company.

10. The method of claim 1 wherein the shallow ion implantation process uses arsenic (As) ions as dopants, an energy ranging from 60 KeV to 80 KeV, and a dosage ranging from 1E13 ions/cm$^2$ to 1E15 ions/cm$^2$.

11. A method of a dual damascene process, the method comprising:

providing a semiconductor substrate, an interconnect being formed on the semiconductor substrate;

spin-coating a first low-k layer on the surface of the semiconductor substrate, the first low-k layer covering the interconnect;

performing a predetermined ion bombardment process to form a densified layer on the surface of the first low-k layer, the densified layer having an amount of dangle bonds several times that of dangle bonds on the surface of the first low-k layer before the bombardment process is performed;

spin-coating a second low-k layer on the surface of the densified layer;

forming a passivation layer on the surface of the second low-k layer, wherein the first low-k layer, the densified layer, the second low-k layer, and the passivation layer together construct a laminated structure; and performing a damascene process to define the laminated structure and using the densified layer as an etch stop layer for forming a damascene opening in the laminated structure, the damascene opening penetrating the laminated structure and connecting with the interconnect;

forming a barrier layer and a metal layer in sequence on the surface of the laminated structure and the internal walls of the damascene opening, the metal layer filling the damascene opening;

performing a metal chemical-mechanical-polishing (CMP) process to remove the metal layer and the barrier layer outside the damascene opening; and forming a second passivation layer on the metal layer.

12. The method of claim 11 wherein the first conductive layer is an inter-metal connection.

13. The method of claim 11 wherein the etch stop layer and the second low-k layer each has a different etching selectivity.

14. The method of claim 11 wherein the first low-k layer and the second low-k layer are composed of the same low-k materials.

15. The method of claim 14 wherein the first low-k layer and the second low-k layer are both composed of poly (arylene ether).

16. The method of claim 11 wherein the shallow ion implantation process uses arsenic (As) ions as dopants, an energy ranging from 60 KeV to 80 KeV, and a dosage ranging from 1E13 ions/cm$^2$ to 1E15 ions/cm$^2$.

17. The method of claim 11 wherein the shallow ion implantation process uses $BF_2^+$ ions with an energy ranging from 50 KeV to 100 KeV and a dosage ranging from 1E13 ions/cm$^2$ to 1E16 ions/cm$^2$.

* * * * *